United States Patent [19]

Levinthal

[11] 4,032,901
[45] June 28, 1977

[54] SYSTEM FOR STORING AND RETRIEVING INFORMATION AT THE MOLECULAR LEVEL

[76] Inventor: Cyrus Levinthal, 435 Riverside Drive, New York, N.Y. 10025

[22] Filed: June 4, 1975

[21] Appl. No.: 583,554

Related U.S. Application Data

[63] Continuation-in-part of Ser. No. 549,450, Feb. 12, 1975.

[52] U.S. Cl. .................. 340/173 NC; 340/173 CH
[51] Int. Cl.² .................. G11C 13/00; G11C 13/02
[58] Field of Search .............................. 340/173 NI

[56] References Cited
UNITED STATES PATENTS 3,119,099 1/1964 Biernat ........................ 340/173 NI

*Primary Examiner*—Terrell W. Fears
*Attorney, Agent, or Firm*—Cooper, Dunham, Clark, Griffin & Moran

[57] ABSTRACT

Disclosed is a system for retrievably storing information in a storage medium comprising a laterally extending layer of separate particles each of which has a size of several hundred Angstroms or less. The individual particles are up to approximately the size of protein molecules or virus particles and can, in fact, be single biological macromolecules, single virus particles, single polystyrene latex particles or other particles or aggregates of equivalent size. The particles may form a monolayer, or they may form a thicker slab as long as the slab surface is smooth compared to the size of a region of the slab used for the storage of a single bit of information. Small regions of this laterally extending layer or its surface, with lateral dimensions of a few thousand Angstroms or less, typically 1000A or less, can be selectively modified by a narrowly focused electron beam without substantially affecting adjacent regions, to thereby store (write in) information as a pattern of modified particles. After the slab surface has been so modified, it can be stabilized by depositing thereon a thin metallic film, and the stored information can be read out by a detecting electron beam.

11 Claims, 20 Drawing Figures

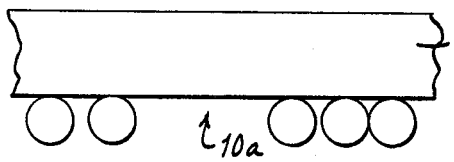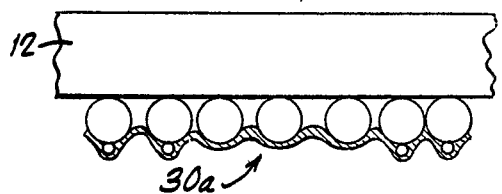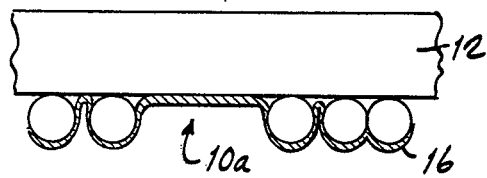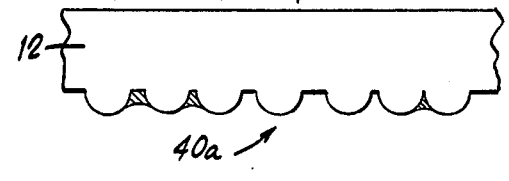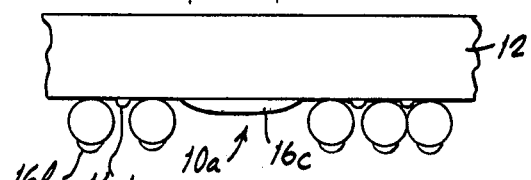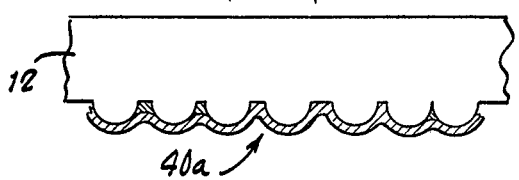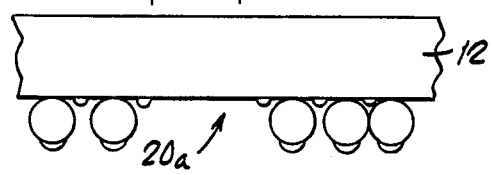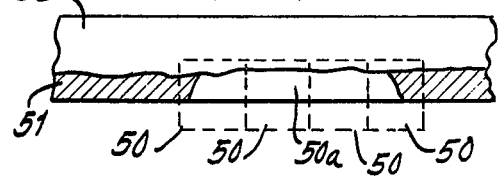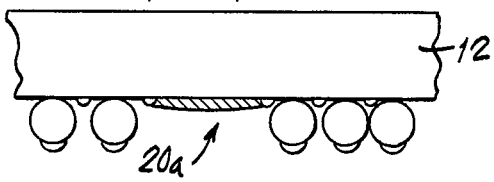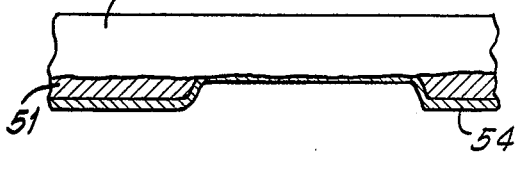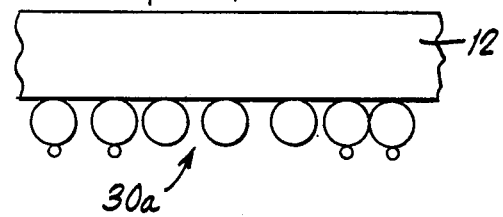

SYSTEM FOR STORING AND RETRIEVING INFORMATION AT THE MOLECULAR LEVEL

REFERENCE TO RELATED APPLICATION

This application is a continuation-in-part of the copending patent application of the same inventor entitled *System For Storing and Retrieving Information at the Molecular Level* and filed on Feb. 12, 1975 under Ser. No. 549,450. Applicant hereby incorporates by reference in this application the entire subject matter of said copending application.

BACKGROUND OF THE INVENTION

The invention is in the field of information storage and retrieval systems, and relates to memories, such as computer memories. The invention is specifically directed to a memory which is very small in size but can store a very large amount of information.

There is an ever growing need for efficiently storing and retrieving large amounts of information, and there are many different storage systems which try to optimize, to varying degrees, factors such as storage capacity, access time, size, cost and the like. The problem is particularly severe where it is desired to store a very large amount of information and to have any portion of its accessible in a minimum time, e.g. the problem of storing the Chemical Abstracts or the problem of storing the inventory records of all the spare parts maintained by the Navy throughout the world. The memories typically used at present, such as magnetic core and semiconductor and similar memories, are satisfactory for many uses, but do not have sufficiently high storage density for many other uses. Research efforts have therefore been directed to alternate storage techniques, such as optical storage. An example of such techniques is the Unicon 690 Laser Store for the Iliac IV computer installation, which has a storage density of about $2.7 \times 10^7$ bits per square inch. Even with optical memories, however, the diffraction limit of the imaging lens imposes a theoretical limit of about $10^8$ bits per square inch, and there is a major technical difficulty in providing high beam deflection to cover a large field. There are, additionally, optical storage memories which employ light sensitive color centers (F-centers, M-centers and $M_A$-centers) in crystals — as discussed, for example, in U.S. Pat. Nos. 3,440,642, 3,673,578 and 3,720,926, but since again light beams are involved in such memories, the same theoretical limit of about $10^8$ bits per square inch is present. A somewhat different approach is taken when using electron beam modulation of storage media. For example, U.S. Pat. No. 3,723,978 relates to a technique using an electron beam to locally charge portions of a storage medium which retain the charge for up to 50 hours, while U.S. Pat. No. 3,760,383 relates to a technique for permanent local thermal destruction of selected macroscopic portions of a storage medium by an electron beam. It appears, however, that the storage density of such electron beam systems is no better than with the optical systems discussed above.

SUMMARY OF THE INVENTION

An object of the invention is to provide a memory for efficiently storing information at a very high density.

The typical storage medium used in the invented system is a laterally extending slab of separate particles randomly arranged in the lateral dimensions. A bit of information is stored in a region (unit) of the slab which is less than a few thousand Angstroms in size, and is typically and preferably about 1000 A or less. The surface of the slab is smooth as compared to the size of the region storing a bit, and the typical variations in depth correspond to one or a few of the separate particles. Each particle is about the size of a protein molecule, or a virus particle, or an equivalent particle, or an aggregate of much smaller particles, e.g. several hundred Angstroms or less. Each particle may in fact be a single, wholly or primarily organic particle, e.g. a single protein molecule, a single virus particle, or a single inorganic molecule or particle, or some combination of an organic and an inorganic particle. Alternately, each particle can be a pair consisting of a larger and a smaller particle, where each particle can be an organic molecule, a virus, or an equivalent particle. Still alternately, each particle can be an aggregate of smaller particles. A particle may be provided with an inorganic cap to facilitate the modification of the particles in accordance with the invention. The slab may be a monolayer of particles, such as the type of layer formed when particles are spread on an air-water interface and then compressed so that on the surface they are randomly but rather uniformly spaced. Alternatively, the slab may be composed of particles arranged in such a way that it is several particles thick. Still alternatively, the slab may be very thick, provided that the surface of the slab is smooth, i.e. the surface is a layer of particles which are randomly arranged in the lateral dimensions but are approximately in the same plane parallel to the surface of the slab.

To write information into the storage medium, an electron beam is focused to a size which is less than a few thousand Angstroms and is at least a few times larger than the size of the particles comprising the surface layer. The electron beam irradiates particles of the surface layer with a sufficient number of electrons to modify them. The modification mechanism is believed to involve the ejection of secondary electrons from the irradiated particles and the rupture of covalent chemical bonds therein, and to possibly involve electrostatic repulsion between parts of the slab. The beam is finely focused and precisely positioned to a spot or a region which is indexed to a coordinate system that is established on the slab by means of a supporting wire grid and/or a grid of metal strips deposited by evaporation or sputtering with lithographic or integrated circuit masking and metal deposition techniques. The electron beam irradiation is done so that the modification of one region does not substantially affect adjacent regions. "Modification" in this context means a change in the visible structure of the slab surface (including the removal of one or more particles or portions thereof from the slab surface), and "visible" means a change detectable by an electron beam of the same general type, either immediately after writing information into the slab or after the slab surface has been stabilized — as by depositing thereon a thin metallic film, so that further irradiation does not modify it.

BRIEF DESCRIPTION OF THE DRAWINGS

FIGS. 6, 8, 10, 12 and 14 illustrate the media of FIGS. 1–5, respectively, after a unit of each has been modified.

FIGS. 7 and 7a, 9, 11, 13 and 15 illustrate the media of FIGS. 6, 8, 10, 12 and 14, respectively, after a stabilization thereof by metallic deposition.

DETAILED DESCRIPTION

An object of the invention is to retrievably store information at the molecular level, i.e. to store one bit of information per one unit of a storage medium, wherein each unit comprises a small number of particles each comparable in size to a single organic molecule, or a single virus, or an equivalent particle, or an aggregate of much smaller particles (i.e. several hundred Angstroms or less).

The invented storage medium is a laterally extending slab of particles which are sufficiently identical to each other to react in substantially the same manner to a finely focused electron beam. Each region used as a storage unit for 1 bit of information must be sufficiently large in size so as to be comparable to the smallest practical electron beam size, and each storage unit must be easily and effectively modifiable by an electron beam. In the context of this specification, the term "modification" is used to mean any modification of the properties of a region used as a storage unit (including the removal of the particles or portions thereof from the slab) which does not substantially affect adjacent regions used as storage units and which can be viewed subsequently by a generally similar type of electron beam (typically after stabilization of the layer).

Figure 1:
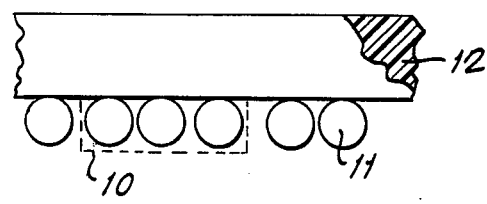
FIGS. 1 through 5 illustrate five different types of storage media in accordance with the invention.

Several examples of such storage media are illustrated schematically in FIGS. 1 through 5. Referring to FIG. 1, the storage medium is a slab comprising a single, laterally extending layer (along a plane perpendicular to the drawing sheet) of substantially identical particles 11, where the particles 11 are either randomly or regularly arranged on the surface of the laterally extending support 12. Each unit 10 is used to store 1 bit of information and comprises several particles 11, where "particle" in this specification means a single organic molecule, a single virus particle, a single inorganic molecule or particle, or a single equivalent particle or a combination of particles — such as an aggregate of much smaller particles. The particles 11 can be proteins which are formed into a monolayer, that is at an air-water interface (as discussed and reviewed in: Davis, J. T. and Rideal, E. K., *Interfacial Phenomena*, Academic Press, New York, 1961; and Cheesman and Davies, "Advances in Protein Chemistry," Volume 9, p. 439 (1954)), and then picked up on a supporting surface. Alternatively, the particles may be picked out of solution and attached onto a supporting surface after the supporting surface has been activated so that it will form covalent bonds with active groups on the particles to be used (as discussed and reviewed in: Oscar Zaborski, *Immobilized Enzymes*, Chemical Rubber Company Press, 1973). A unit may be, for example, about 10 particles 11, on the average, but it should be clear that when the particles 11 are randomly arranged, the number of particles 11 per unit 10 may differ from unit to unit.

When subjected to suitable electron beam radiation, each irradiated particle of slabs of this type is modified as discussed, for example, in: Breedlove, Jr., J. R. et al., "Molecular Microscopy: Fundamental Limitations," *Science*, 1970, pp. 1310–1313; Williams, R. C. et al, "Electron Microscopy of Tobacco Mosaic Virus Under Conditions of Minimal Beam Exposure," *J. Mol. Biol.*, Vol. 52, 1970, pp. 121–123; Isaacson. M. et al., "Electron Beam Excitation and Damage of Biological Molecules; Its Implications for Specimen Damage in Electron Microscopy," *Radiation Research*, Vol. 55, 1973, pp. 205–224; Glaeser, R. M., "Limitations to Significant Information in Biological Electron Microscopy as a Result of Radiation Damage," *J. Ultrastructure Research*, Vol. 36, 1971 pp. 466–482; and Hall, T. A. et al., "Beam-included Loss of Organic Mass Under Electromicroprobe Conditions," *Journal of Microscopy*, Vol. 100, July 1973, pp. 177–188.

For the purposes of this invention, each unit 10 must be individually modifiable by an electron beam 14 which does not substantially modify adjacent units and can be indexed to any selected unit 10. For this, the electron beam 14 must be focusable to a size comparable to that of an individual unit 10. In terms of the invented storage medium, in which the size of a unit 10 is comparable to the size of several organic molecules or viruses, i.e. from a few thousand Angstroms down to hundreds of Angstroms, and typically and preferably 1000 A or less, the electron beam 14 must be focused to a corresponding comparable size of a few thousand Angstroms or less, and must have sufficient intensity so that each selected unit can be modified quickly, to ensure a sufficiently short writing time. Typically, the electron beam 14 must provide a few electrons per square Angstrom per access time, where access time is the time necessary to detectibly modify the selected unit 10 (write in a bit of information). Such electron beam intensity can be provided for typical write access times of about 10 nanoseconds to about 1 microsecond per bit, i.e. for a write-in rate of from about 1 megabit to about 100 megabits per second, by devices of the type of the Crewe scanning electron microscope, discussed for example in: Crewe, A. V., "A High Resolution Scanning Electron Microscope," *Scientific American*, April 1971, pp. 26–35; or by scanning transmission electron microscopes of the type of the Perkin-Elmer STEM HFS-2S or the Coates and Welter Mod. 106 STEM. Such microscopes can provide beam current density of about $10^3$ to $10^5$ amp./cm$^2$ for a spot having a diameter of about 200 Angstroms or less and can deflect the beam with accuracy of one in $10^4$ to $10^6$ in each dimension, some using computer control (e.g. the Mod. 106 STEM).

When an individual unit 10 of the layer shown in FIG. 1 is irradiated with an electron beam 14, it is modified through a mass-loss process which is believed to involve emission of secondary electrons, the rupture of covalent bonds and electrostatic disruption. Specifically, it is believed that when the primary electrons of the beam 14 interact with the particles 11 forming the unit 10, these primary electrons lose their energy mainly by producing secondary electron emission from the atoms of the particles 11. This is believed to weaken and break covalent bonds between parts of the unit 10, and to perhaps cause a positive charge on the particles 11, which is believed to produce a repulsive force between the irradiated particles 11 (or at least parts of them) and the remainder of the storage medium, thereby causing either the separation of one or more entire particles 11 forming a part of the unit 10 from the storage medium or the local destruction and separation of parts of each particle 11 from the remainder of the storage medium. It has been experimentally observed that rapid and large-scale mass loss of organic matter occurs under ionizing radiation causing total charge of about $10^{-3}$ to $10^{-2}$ coul./cm$^2$, which corresponds to about 0.6 to 6 primary electrons passing through each square Angstrom of the target material. Since the storage medium is irradiated in vacuum, as described below, the separated particles 11 or portions thereof are drawn away in the vacuum. The result, as illustrated in FIG. 6, is that all or a portion of the irradiated unit 10 is missing from the space 10a, while the units 10 adjacent the irradiated unit 10 are not substantially affected. Note that while it is well established that some type of mass-loss modification occurs under irradiation, the modification mechanism is not well understood, and other phenomena may in fact be involved. Note additionally that the electron beam 14 may come either from above or from below the storage medium, and may in fact be non-perpendicular to the plane of the medium.

While the resulting storage medium may be viewed immediately (without further processing) under an electron microscope to detect the location of the modified unit at 10a (i.e., the missing or partially missing unit 10a), it may be desirable to first stabilize the storage medium, so that further radiation would not destroy the information stored therein, and so that the stored information can be read easily and at high speed by an electron beam. For this purpose, a metal film 16 may be deposited onto the storage medium, e.g. by vacuum evaporation or sputtering from below as viewed in FIG. 1, to thereby form a thin metal film 16 on the surface of the layer. The metal film 16 may be continuous, as shown in FIG. 7, where the metal film 16 curves deeply toward the support 12 at the location 10a of the modified unit 10, but still remains continuous. Alternately, the metal film 16 may be, as illustrated in FIG. 7a, in the form of a cap 16b over each particle of an unmodified unit 10, possible a background region 16d on the surface of the support 12 exposed between adjacent particles of the unmodified units 10, and a larger background region 16c on the exposed surface of the support 12 between the units 10 facing the modified unit. In either of the cases illustrated in FIGS. 7 and 7a, the metal region at the location 10a of the modified unit 10, or surrounding the location 10a, differs from the metal associated with unmodified units 10 in its response to an electron beam, and can be defected either by conventional electron mocroscopic techniques or by the technique described below for reading out the information stored in the invented storage media.

Figure 2:
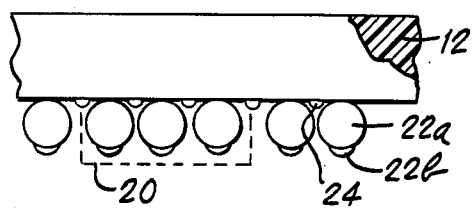

The alternate storage medium shown in FIG. 2 is similar to that discussed in connection with FIG. 1, differing only in that each unit 20 is formed by several particles 22a each of which has a cap 22b formed of a material which is an isolator and preferably has high secondary emission properties. Background regions 24 may be formed of the same isolator material on the portions of the support 12 exposed between the particles of adjacent units 20. It is believed that the caps 22b assist in the unit modification mechanism because the material for the caps can be selected to have a higher secondary emission coefficient than the remainder of the units 20. Specifically, it is believed that when the cap 22b of a particle 22a is irradiated by the beam 14, the positive electrostatic charge thereof due to secondary emission of electrons from the cap 22b is higher than that of the particle 22a alone, and if the adhesion of the cap 22b to the particle 22a is higher than that of the particle 22a to the remainder of the storage medium, modification of the irradiated unit 20 is facilitated. Note again that the modification mechanism is not fully understood, and this is only a hypothesis.

Figure 3:
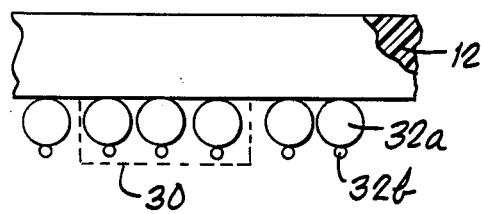

The still alternate storage medium illustrated in FIG. 3 differs from FIGS. 1 and 2 in that each unit 30 is formed of larger particles 32a and smaller particles 32b attached to each other, as by a chemical or other bond. When a unit 30 is irradiated with a beam 14, one or more of the smaller particles 32b break away from the larger particles 32a to which they are attached, through a mechanism which is believed to be similar to the modification mechanisms discussed above, with the result that a modified unit 30 is left with less mass than an unmodified unit. It is possible that only parts of the smaller particles 32b break away, and it is additionally possible that not only the smaller particles, but all or a portion of one or more of the larger particles 32a of an irradiated unit 30 may break away from the medium. The exact mechanism is not fully understood.

Figure 4:
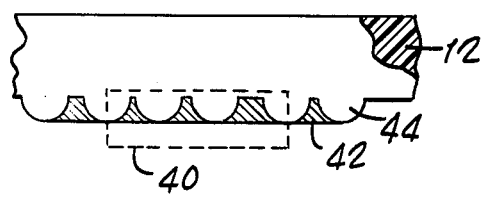

A still alternate storage medium is illustrated in FIG. 4 and comprises a support 12 into which is partly embedded a layer of particles 44, several of which comprise a storage unit 40. The downwardly facing surface of the laterally extending layer of particles 44 has the interstital spaces between the particles 44 at least partly filled with regions 42 of a homogeneous insulator which preferably has high secondary emission properties, i.e. it can be easily locally charged with an electron beam. The adhesion between the particles 44 and the homogeneous insulator regions 42 can be relatively low, so that when a unit 40, formed of the homogeneous insulator regions 42, is irradiated with an electron beam 14, the irradiated regions 42 break away from the support 12 and the particles 44 either partly or completely, to thereby form a modified unit 40a (FIG. 9).

Figure 5:
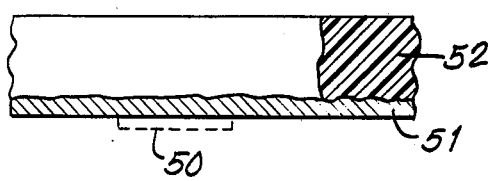

A still alternate storage medium is illustrated in FIG. 5 and comprises a support 52, which is a material formed of subparticles which are substantially smaller than a unit, and a thin layer 51 of a material formed of similar subparticles. A unit 50 of the material 51 is comparable in size to the units discussed in connection with FIGS. 1-4 (but is formed of a multiplicity of subparticles, each subparticle being, for example, a molecule). When irradiated by the electron beam 14, all or a part of the unit 50 breaks away from the support 52 and from adjacent portions of the thin layer 51, to thereby form a modified unit 50a (FIG. 10).

After selected units of the storage media shown in FIGS. 1 through 5 have been selectively modified to form structures of the type illustrated in FIGS. 6, 8, 10 and 14, and the modified structures have been stabilized to form the structures illustrated in FIGS. 7 and 7a, 9, 11, 13 and 15, respectively, the stored information may be read either by standard electron microscope techniques, or by a technique similar to that used for storing the information.

For storing the desired information into the invented storage medium, the electron beam 14 must be focused down to a size about equal to or smaller than (or at least comparable to) that of an individual unit, and this can be done with an electron microscope of the types referenced above. Specifically, the invented storage medium is placed at the specimen location of the microscope, in vacuum, with the plane of the slab or layer transverse to the beam, the beam is indexed to the unit which should be modified, and the selected unit is irradiated with sufficient intensity and for a sufficient period of time to modify it.

Figure 16:
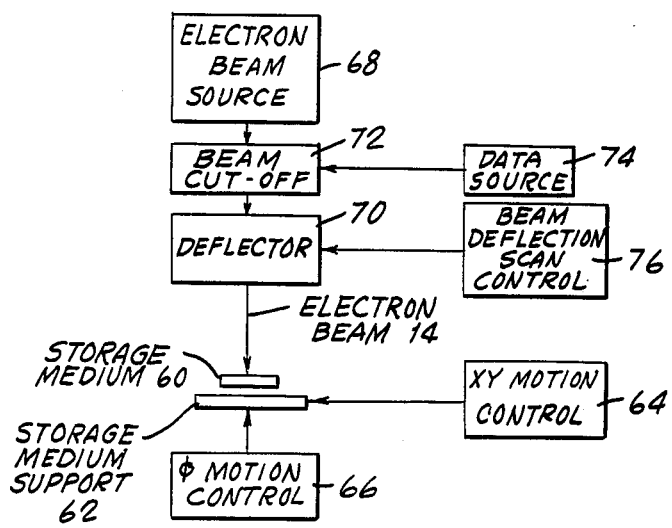
FIG. 16 illustrates a device for storing (writing in) information in the invented storage media and for subsequently stabilizing the media.

Referring to FIG. 16, which illustrates schematically the essential portions of a device for storing (writing) information in the invented medium, a storage medium 60 (which may be any of the media of FIGS. 1–5) is placed at the specimen location of a Crewe-type scanning electron microscope, on a specimen support 62 which is controlled for X, Y motion in a plane transverse to the beam by an X, Y motion control 64, and may additionally be controlled for rotational motion in its plane by another motion control 66. The specimen support 62 and the motion control 64 may be as in a conventional scanning electron microscope, or may be of the type described in U.S. Pat. Nos. 3,723,978 and 3,760,383. Alternately, the support 62 and the controls 64 and 66 may be of the type described in U.S. Pat. No. 3,541,338. The electron beam is generated at a source 68 and its lateral position is deflected along the plane of the storage medium 60 by a deflector 70, as is standard in scanning electron microscopes. Additionally, there is a beam cutoff device 72, controlled by a data source 74 operating in synchronism with a beam deflection scan control device 76 which controls the deflector 70, so that the electron beam can be allowed to strike only those units of the storage medium 60 which are to be modified in accordance with the data provided by the data source 74. As discussed earlier, the size of the beam striking the units of the storage medium 60 must be comparable to the size of a single unit and the beam must have sufficient intensity to provide electron density of a few electrons per square Angstrom for the time interval necessary to modify a single unit, this interval being from about 10 nanoseconds to about 1 microsecond per bit.

To stabilize the storage medium after selected units thereof have been modified, a suitable metal (i.e. gold or uranium or a mixture of gold and platinum) is deposited thereon, to form the metallic film illustrated in the drawings, using — for example — vacuum deposition or sputtering techniques of the type used in the fabrication of integrated circuits.

Figure 17:
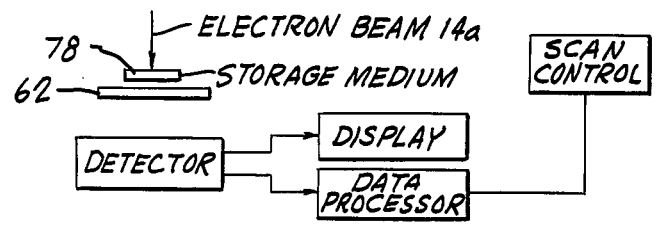
FIG. 17 illustrates a device for detecting (reading) the information stored in the invented storage media.

To read the recorded information, a stabilized storage medium 78 is placed on the same support 62 of the same type microscope, as illustrated in FIG. 17, and is scanned by the same type electron beam 14a to detect whether each unit accessed during the reading scan is modified or not. The reading beam's intensity may be the same as, or different from that of the writing beam. Any suitable detector 80, of the several types of detectors commonly used in scanning electron microscopes of the Crewe type, can be used. The information may be displayed, as the scan progresses, at a display 82, which may be the standard display or a Crewe-type microscope, with the bit of information stored at each unit being identified by whether the location on the display 82 corresponding to the unit is bright or dark. Alternately, or additionally, the output of the detector 80 may be supplied to a data processor 84 operating in synchronism with the scan control 76 for conversion to form suitable for other uses.

Figure 18:
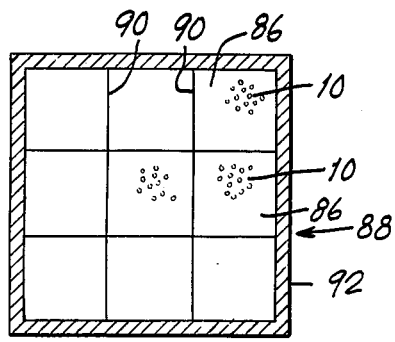
FIGS. 18 and 19 illustrate arrays formed of individual storage media of the invented type separated from each other by a reference grid.
Figure 19:
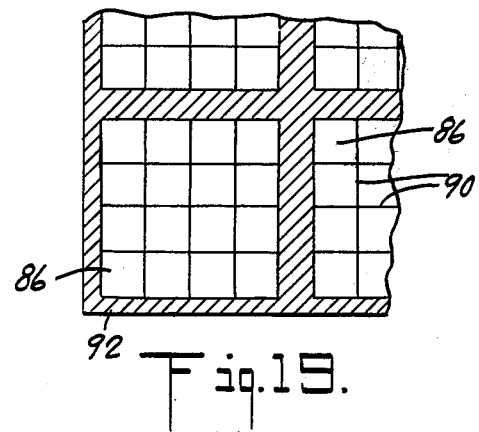

Referring to FIG. 18, a plurality of the invented storage media 86 may be arranged to form a larger array 88 comprising a rectangular arrangement of individual storage layers or slabs 86 separated from each other by a rectangular reference grid of metal bands 90, with the entire structure being surrounded by a wider metal border 92. Each of the metal bands 90 may be a heavy metal, such as gold or uranium, and may have the width of about 10 or more individual storage units, or can be about 1 micron wide, and the border 92 may be several times as wide as a band 90. The bands and borders may be formed by lithographic or integrated circuit masking and metal deposition techniques. Each of the storage media 86 may have, for example, about $10^4$ units per side, with a total storage capacity of about $10^8$ units (for $10^8$ bits of information). Of course, a larger capacity is possible, and any suitable capacity may be chosen. Any individual storage medium 86 may then be accessed by detecting the border 92 with the electron beam, then detecting the number of grid bands 90 which must be traversed in order to reach the desired storage medium 86. Then any individual storage unit within the selected medium 86 is accessed by calculating the number of units which must be traversed by the beam to reach the location of the desired unit, and deflecting the beam 14 accordingly.

As specific examples of the components forming the storage media described above: (1) each particle 11 in FIG. 1 can be a single Catalase molecule (see Klug A. et al., "An Optical Method for the Analysis of Periodicities in Electron Micrographs;" and "Some Observations on the Mechanism of Negative Staining," *J. Mol. Biol.* (1964) 10, 565–569) or — alternately — each particle 11 may be a single virus of the human YG1 immunoglobin referenced above; (2) each particle 22a in FIG. 2 can be either of the particles referenced in (1) immediately above, with a cap of $SiO_2$ whose thickness is of the order of tens of Angstroms; (3) each particle 32a in FIG. 3 and each particle 44 in FIG. 4 can be either of the particles referenced in (1) immediately above, and each particle 32b can be any similar, but preferably smaller particle, which can be bonded to a particle 32a; (4) the insulator material forming each unit 40 in FIG. 4 can be $SiO_2$; (5) the material forming the layer 51 in FIG. 5 can be $SiO$ or a mixture of $SiO$ and $SiO_2$, with the thickness of the layer being of the order of tens of Angstroms; (6) the support 12 in FIGS. 1, 2, 3, and 4 can be an epoxy or Lucite type material formed in a layer or film which is 100 Angstroms thick or thicker; (7) the material for the support 52 can be the same as the material for the support 12; and (8) the stabilizing metal and the material for the bands and borders can be gold or uranium or a mixture of gold and platinum.

One specific method of preparing a storage medium for use in the invention is to prepare a plastic film of the type conventionally used in the support of particles examined in an electron microscope and activate the plastic using the methods for immobilizing enzymes. This activated film is then placed in a solution of macromolecular particles for a sufficiently long time so that a monolayer of attached particles is formed on the film. The film is then washed to remove unbound particles and dried for use as a storage medium in accordance with the invention. In the conventional drying process, a liquid/gas interface travels through the surface layer and the surface tension causes a flattening of particles or molecules which project above the plastic film. The critical point drying method avoids this deformation from the surface tension forces by transferring from the liquid to the gas phase above the critical point of the fluid used. The water is replaced by a fluid missible with the liquid to be heated above its critical point. This final liquid is generally liquid $CO_2$ although Freon-13 and nitrous oxide have been used (see detailed description of the method given in the special data sheet and instructions for the model E-3000 Critical Point Drying Apparatus for use with liquid $CO_2$, Freon-13 or nitrous oxide. Sold by Polyscience Inc., Paul Valley, Industrial Park, Warrington, Penn. 18976).

As a still more specific example of a procedure for preparing an activated membrane film, start with polystyrene dissolved in benzene as supplied by Ladd Inc. and prepare a film as described by Hall, C. E., "Introduction to Electron Microscopy", McGraw-Hill, 1953. The polystyrene membrane film is activated by the methods described in Filippusson, H. and Hornby, W. E., "The Preparation and Properties of Yeast Betafructofuranosidase Chemically Attached to Polystyrene", *Biochemical Journal* 120, 1970, pp. 215–219. The polystyrene is converted to polyaminostyrene in two reactions: first, nitration is effected by suspending the film at 0° C in 47% (v/v) $HNO_3$ (sp. gr. 1.42)—$H_2SO_4$ (sp. gr. 1.84) and the liquid is stirred for approximately 20 minutes and then the film is washed in water. Reduction is then brought about by suspending the film in 6% (w/v) $Na_2S_2O_4$-2 M KOH for about 4 hours at 70° C. The film is finally washed in water. The polyaminostyrene is then diazotized by placing the film in 300 ml. of 0.6 M HCl at 0° C. Ten portions of 2 ml. each of ice cold 20% (w/v) $NaNO_2$ in water is added over a period of 14 minutes. The resulting polystyrene-diazonium chloride is washed quickly with mM HCl and immediately thereafter transferred to a solution containing 300 mg. of betafructofuranosidase in 30 ml. of 50 mM-$Na_4P_2O_7$ adjusted to pH 8.0 with 2.0 M HCl. The solution is agitated gently for 2 hours at 0° C and then for a further period of approximately 3 hours at 4° C, after which time the film is again washed with water, 0.5 M NaCl, mM HCl and water. Approximately 1 liter of water is used for each of these washings. The film is then stored in water at 4° C until drying in the critical point drying apparatus. A large number of different protein molecules can be attached covalently to activated polyaminostyrene; the reactions involved and the references are given in Zaborsky, O. R., *Immobilized Enzymes*, Chemical Rubber Company Press, 1974, p. 11.

In conclusion, the invention is directed to storing information at a very high density, of the order of $10^9$ to $10^{10}$ bits per $cm^2$, in a storage medium which comprises a layer of units, each unit being a few thousand Angstroms or less in size, and typically being about 1000 A or less. Each unit typically comprises several particles such as macromolecules, viruses, or combinations or aggregates of particles. Information is stored into such storage media by modifying selected units with a finely focused electron beam, as in a scanning electron microscope, and the stored information is read out with a similar electron beam, typically after stabilization of the media by metallic films.

I claim:

1. An information storage medium comprising:
a substantially continuous layer of particles comprising an array of bit storage units, each bit storage unit being less than a few thousand Angstroms in size and each pair of adjacent bit storage units being spaced from each other by no more than up to a few thousand Angstroms, each unit comprising several particles of a material modifiable when irradiated by a focused electron beam without thereby modifying bit storage units adjacent thereto, and each bit storage unit storing one bit of information; and
means for supporting the layer of particles and the bit storage units thereof.

2. An information storage medium as in claim 1 wherein each of the particles comprising a bit storage unit is selected from the group consisting of: a single organic molecule, a single virus, a single organic molecule having an insulator material cap attached thereto, a single virus having an insulator material cap attached thereto, a larger and smaller organic molecule attached to each other, an inorganic molecule, an aggregate which is partly organic and partly inorganic, a larger and smaller virus attached to each other, an insulator region in the interstitial space between adjacent particles on the surface of an extended layer, a plastic particle, and a region of material formed of subparticles which are substantially smaller in size than a unit.

3. An information storage medium comprising a support and an extended layer of bit storage units on said support, each unit being a few thousand Angstroms or less in size, said layer comprising units in a first state and units in a second state, and means disposed at each transition between units and having a defined response to irradiation by an electron beam, the defined response of the means at a transition between a unit in the first state and an adjacent unit in a second state being different than the defined response of the means at a transition between two adjacent units which are in the same state.

4. An information storage medium comprising a layer of bit storage units and a metalic layer overlaying the storage units, each unit being of the order of thousands of Angstroms of less in size, wherein the metallic layer adjacent one or more selected units of the layer of bit storage units has a first selected orientation with respect to the layer of bit storage units and the metallic layer adjacent the remaining units of the layer of bit storage units has a second selected orientation with respect to the layer of bit storage units, said first and second selected metallic layer orientations being substantially different from each other and causing the respective bit storage units to have a substantially different response to an irradiating electron beam.

5. An information storage medium comprising an extended, substantially continuous layer comprising a plurality of units arranged side-by-side along the layer, each unit being a few thousand Angstroms or less in size, with one or more selected units being substantially different from the remaining lattice units in their response to selected electron radiation, wherein said selected units are substantially identical to each other in said response and the remaining units are substantially identical to each other in said response but are different in said response from said response from said selected units.

6. An information storage medium comprising a plurality of bit storage units, each unit being a few thousand Angstroms or less in size, each pair of adjacent units being separated from each other by a distance of a few thousand Angstroms or less, each unit comprising several particles, and a reference grid separating multinit parts of the layer from each other and formed of a material whose electron beam response is substantially different from that of at least a portion of the storage units.

7. An information storage system comprising:
   a storage medium comprising a substantially continuous support and a lattice of bit storage units disposed on the support, each unit being a few thousand Angstroms or less in size; and
   means for selectively permanently modifying individual units of the lattice, to thereby store information as a pattern of modified lattice units.

8. A system as in claim 7 including means for stabilizing the storage medium after modifying selected units thereof by depositing a metallic layer on the storage units, wherein the metallic layer portion adjacent a modified unit differs from the metallic layer portion adjacent an unmodified unit.

9. An information storage system comprising:
   a storage medium comprising a substantially continuous support, a thin layer disposed on said support and comprising a lattice of bit storage units, each unit being a few thousand Angstroms or less in size and comprising several particles, with selected units having electron beam response which is substantially different from that of the remaining units; and
   means for detecting and identifying said selected units.

10. A memory storage device comprising a wire grid with a polymer layer disposed on its top surface and extending into its intrastices said polymer comprising a backbone of monomers chemically bound through functionally reactive groups thereon to macromolecular particles which are modifiable when irradiated with a focussed electron beam, said macromolecular particles each having a diameter of from about 50 to 300 Angstrom units and selected so that the modification of one particle does not substantially affect particles adjacent thereto.

11. A method of preparing a memory storage device which comprises:
   coating a wire grid with a polymer layer, said polymer being comprised of monomer having functionally reactive groups; and
   chemically combining said polymer through said reactive groups with macromolecular particles having a diameter of from about 50 to 300 Angstrom units, modifiable when irradiated with a focussed electron beam, and selected so that the modification of one particle does not substantially affect particles adjacent thereto.

* * * * *